United States Patent [19]
Bartz

[11] Patent Number: 5,493,298
[45] Date of Patent: Feb. 20, 1996

[54] DITHERED ANALOG-TO-DIGITAL CONVERTER

[75] Inventor: Manfred U. Bartz, Snohomish, Wash.

[73] Assignee: Hewlett-Packard Company, Palo Alto, Calif.

[21] Appl. No.: 356,923

[22] Filed: Dec. 14, 1994

Related U.S. Application Data

[63] Continuation of Ser. No. 24,544, Mar. 1, 1993, abandoned.

[51] Int. Cl.⁶ .................................................. H03M 1/20
[52] U.S. Cl. ......................... 341/131; 341/131; 341/118
[58] Field of Search .................................. 341/118, 126, 341/131, 139, 140, 144, 155

[56] References Cited

U.S. PATENT DOCUMENTS

| | | | |
|---|---|---|---|
| 4,550,309 | 10/1985 | Hiller et al. | 340/347 AD |
| 4,764,748 | 8/1988 | Geen et al. | 341/131 |
| 4,812,846 | 3/1989 | Noro | 341/131 |
| 4,814,767 | 3/1989 | Fernandes et al. | 341/158 |
| 4,914,439 | 4/1990 | Nakahashi et al. | 341/131 |
| 4,968,988 | 11/1990 | Miki et al. | 341/121 |
| 4,996,530 | 2/1991 | Hilton | 341/120 |
| 5,134,399 | 7/1992 | Hiller | 241/131 |
| 5,168,459 | 12/1992 | Hiller | 364/724.19 |
| 5,187,481 | 2/1993 | Hiller | 341/131 |
| 5,189,418 | 2/1993 | Bartz et al. | 341/131 |

OTHER PUBLICATIONS

Honig, et al., *Adaptive Filters*, excerpt from book, Sections 3.1 and 3.2, pp. 48–53, 1985.

*Primary Examiner*—Marc S. Hoff

[57] ABSTRACT

A dithered analog-to-digital converter includes a correlator to detect dither residue in the output signal. The correlator output is accumulated and used in a feedback loop to control the gain of the dither signal so as to null the residue. Problems associated with the low bandwidth of the feedback loop, and corruption of the accumulator value due to overload, are addressed by provision of a preload register from which the accumulator is initialized on power-up and on detection of an overload. This approach provides quick settling time and avoids statistical anomalies associated with decimation approaches to overload.

16 Claims, 3 Drawing Sheets

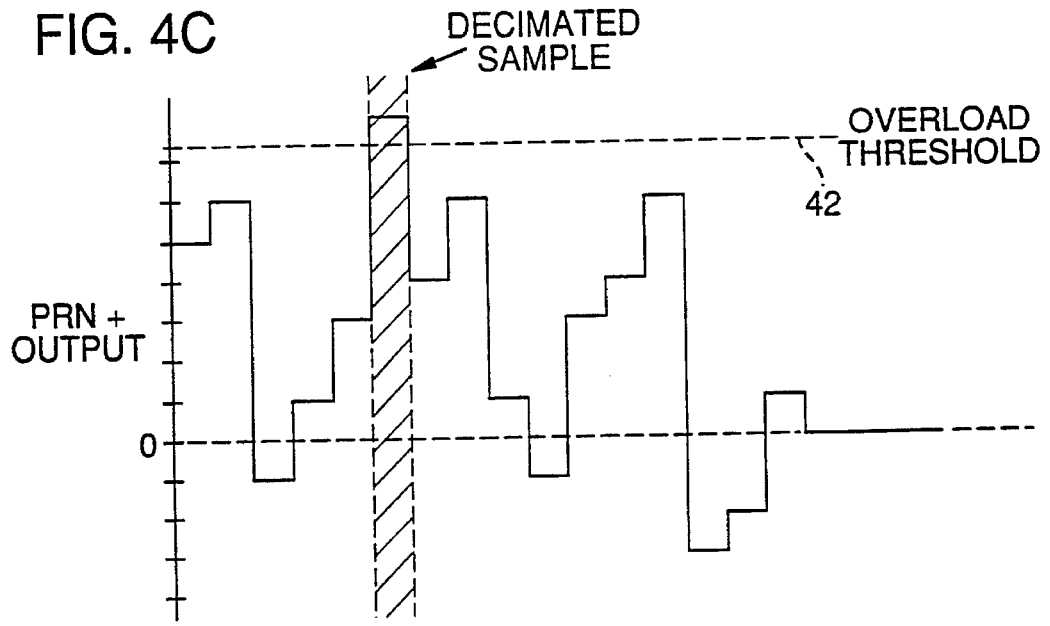
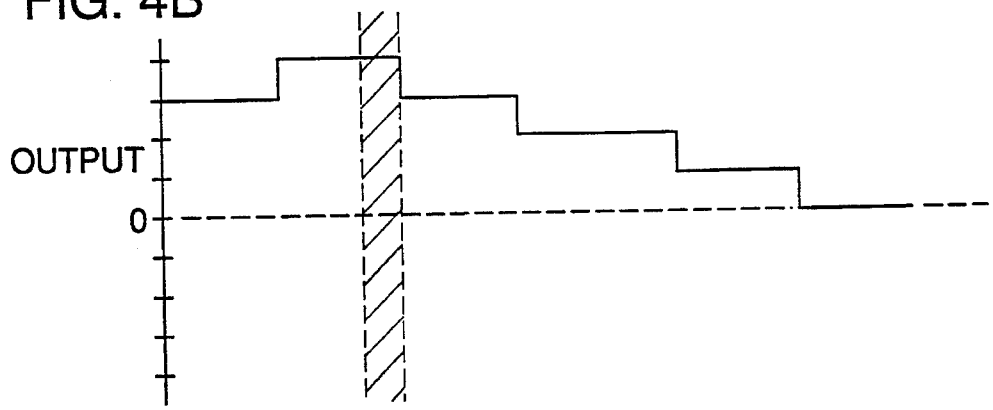
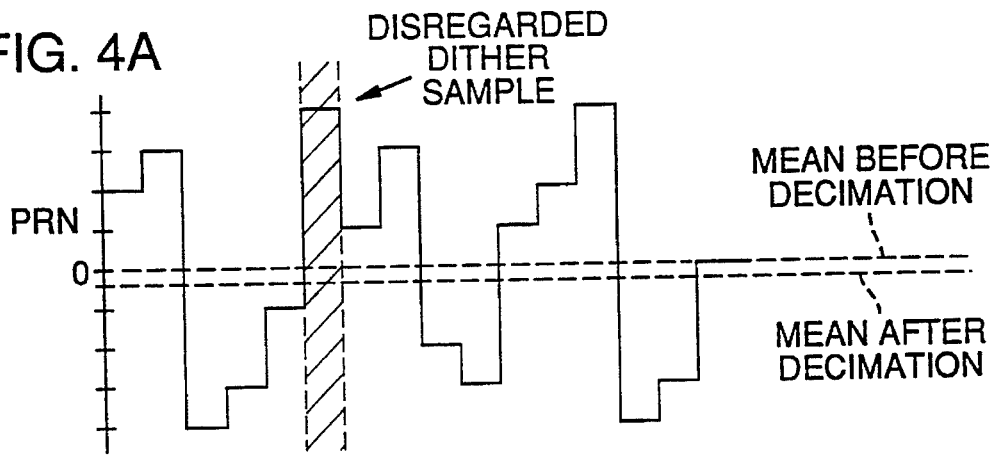

DITHERED ANALOG-TO-DIGITAL CONVERTER

The present application is a continuation of application Ser. No. 08/024,544, filed Mar. 1, 1993, abandoned.

FIELD OF THE INVENTION

The present invention relates to dithered analog-to-digital converters (ADCs), and more particularly relates to an improved method and apparatus for removing artifacts of the dither signal from the ADC output signal.

BACKGROUND AND SUMMARY OF THE INVENTION

As shown by the block diagram of FIG. 1, dithered analog to digital conversion involves adding a random noise signal ("dither") to an input analog signal, converting the combined signal into digital form, and then subtracting the dither signal from the digitized output. This technique improves the resolution and linearity of the conversion by effectively smoothing the quantization errors of the ADC's transfer function.

A problem with dithered ADCs occurs when subtraction of the digital dither signal from the digital output signal fails to completely remove the dither signal. Any remaining residue, or artifact, of the dither signal in the digital output signal results in the digital output signal being an inaccurate representation of the analog input signal.

Dither residue is particularly a problem in situations in which the dither signal is large relative to the input signal (so-called "large-scale" dithered ADCs). In such situations, even slight imperfections or gain variations in the analog portion of the ADC, the dither DAC, or the associated linear amplifiers, can result in imperfect cancellation of the dither in the output signal by subtraction of the original dither signal.

In U.S. Pat. No. 5,187,481 (incorporated herein by reference) there is described a dithered ADC having an active gain control loop to eliminate such gain errors. A representative block diagram is shown in FIG. 2. In that system, the dither signal is correlated with the digital output after subtraction, and the correlated value is accumulated. The correlation indicates the magnitude of the imperfectly cancelled dither residue and is used in a feedback loop to modify the amplitude or gain of the original dither signal. This feedback loop thus assures the subtraction is performed more precisely.

In theory, the foregoing technique is simple. In practice, however, the technique encounters a number of technical complications. The present invention is directed to solutions to these complications so that the full advantages of the foregoing technique can be attained.

One complication is that the loop bandwidth of the feedback loop is very low. This is a necessary result from control theory: the design parameters for minimizing the dither subtraction errors necessitates larger gains in the feedback loop, which in turn yields longer time constants. The consequence of this complication is that at power-on or other initialization, the long time constant of the feedback loop results in a lengthy settling period during which the dither subtraction gradually gets better. If the circuit is employed in a measurement instrument, the instrument's frequency domain noise floor changes as the subtraction errors slowly decrease. Optimum measurements cannot be performed until the noise errors have decreased and the noise floor has settled out.

A second complication relates to overloads. Overloads are common occurrences when signals exceed the maximum limits or ranges of the components—such as the ADC. When an overload occurs, false data values are propagated through the system. In the case of the correlator/accumulator, these false values are also correlated to the dither and therefore corrupt the contents of the accumulator. This results in a shift in the gain of the feedback control signal. Again, if the circuit is employed in a measurement instrument, such an overload manifests itself as a degradation of the instrument's frequency domain noise floor. If the overload is sustained or recurs, the accumulated errors compound. Due to the large time constants of the feedback loop, these errors take a long time—often several minutes—to decrease and settle out after the overload is removed.

In accordance with one aspect of the present invention, the former problem (slow error settling) is alleviated by initializing the accumulator with a nonzero value. The value is chosen to approximate the ultimate accumuland, and serves to set the dither gain to a preestablished value, thereby providing more nearly optimum cancellation of the dither signal immediately on power-up.

Surprisingly, the latter problem (overload) is alleviated in the same manner (initialization of the accumulator), as detailed more fully below.

The foregoing and additional features and advantages of the present invention will be more readily apparent from the following detailed description, which proceeds with reference to the accompanying drawings.

BRIEF DESCRIPTION OF THE DRAWINGS

FIGS. 4a, 4b and 4c are plots of PRN, an output signal, and their sum, respectively, illustrating why decimation is not a satisfactory solution to overloads.

DETAILED DESCRIPTION

Figure 1:
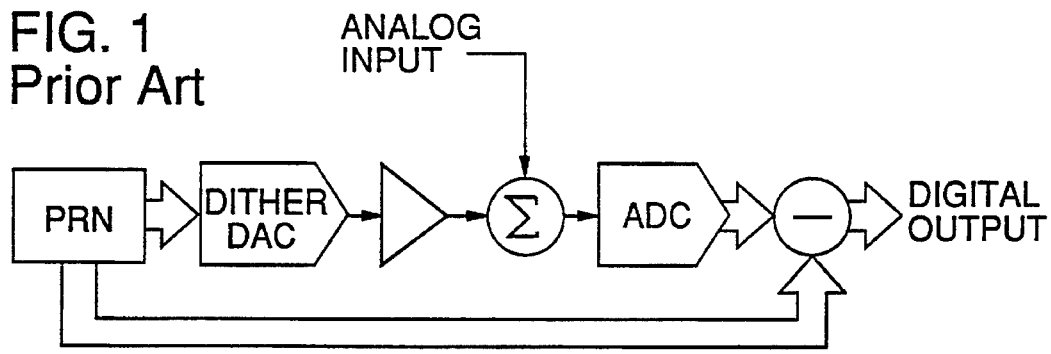
FIG. 1 is a block diagram of a prior art dithered ADC.
Figure 2:
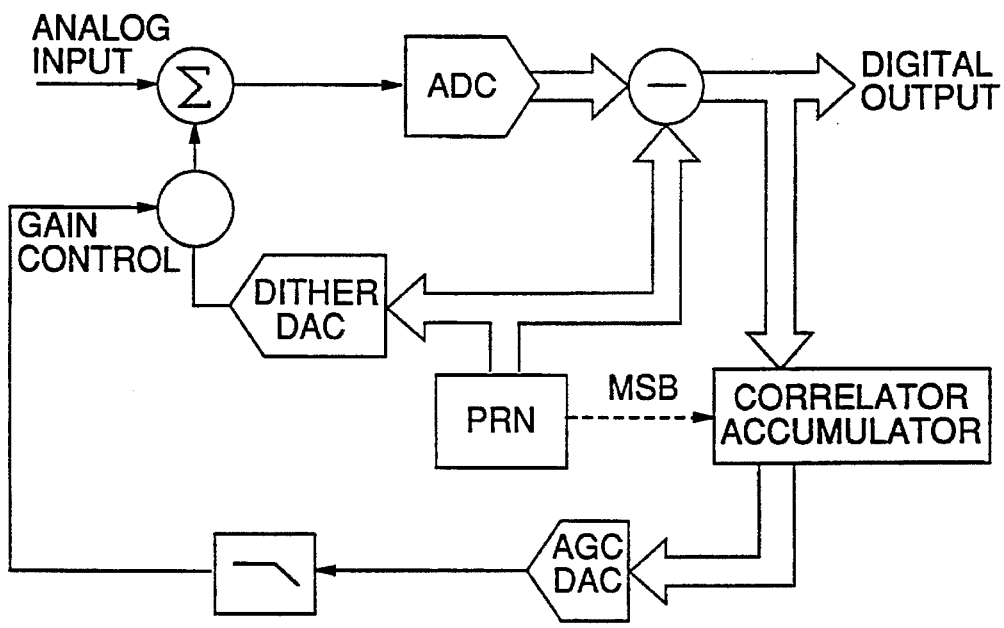
FIG. 2 is a block diagram of a dithered ADC employing correlation to detect and cancel dither residue in the output signal.
Figure 3:
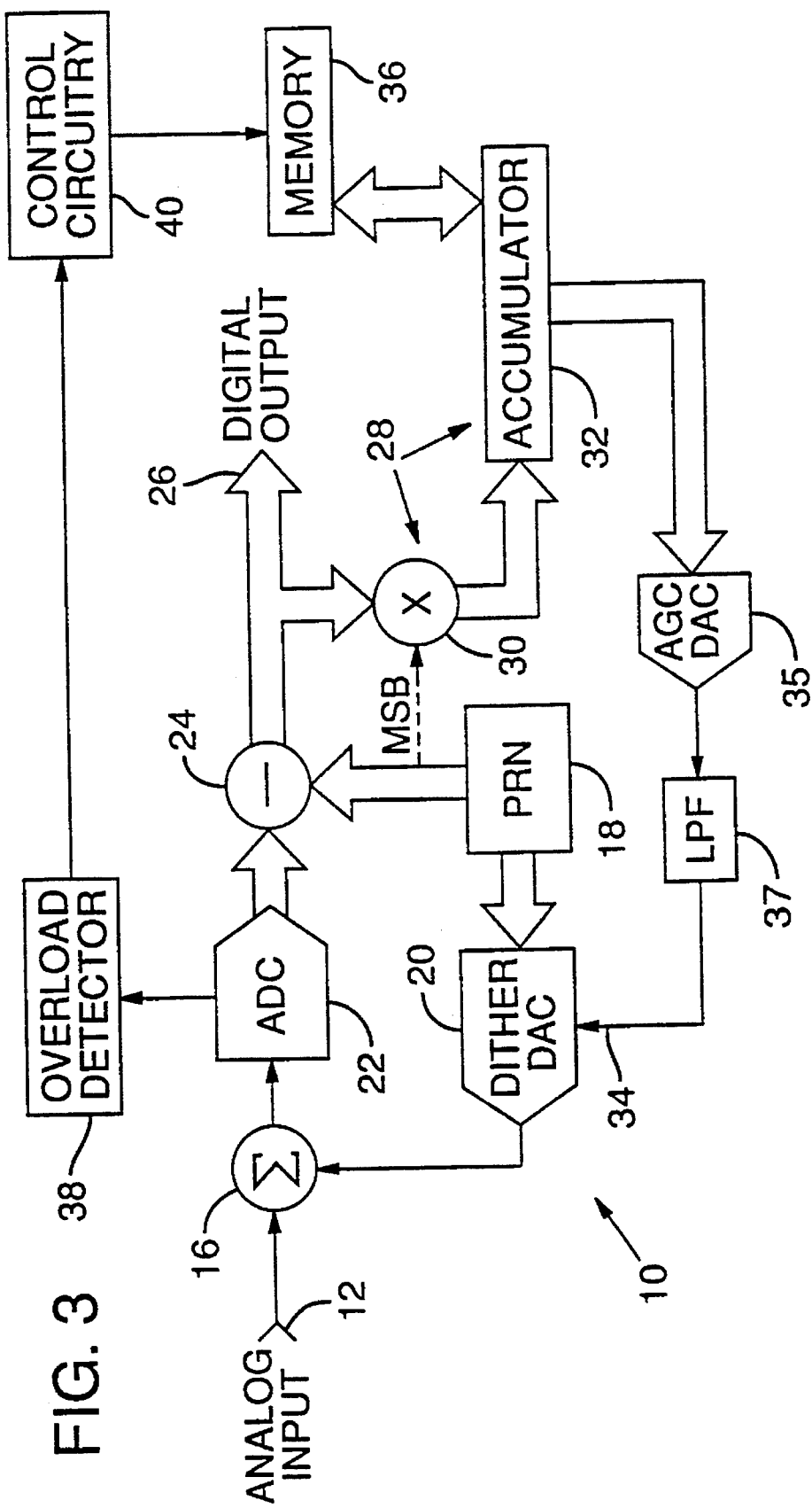
FIG. 3 is a block diagram of a dithered ADC according one embodiment of the present invention.

FIG. 3 shows an analog-to-digital converter system 10 according to one embodiment of the present invention. An input analog signal is applied via input 12 to one input of an analog summation circuit 16. A second input of analog summation circuit 16 is provided with an analog dither signal. The analog dither signal is generated by a pseudo random noise source 18 in cooperation with a digital to analog converter (DAC) 20. Noise source 18 provides a stream of digital random noise words; DAC 20 converts them to analog form. Summation circuit 16 sums the analog dither signal with the input signal and provides the resulting summed signal to the input of an analog-to-digital converted (ADC) 22.

ADC 22 converts the summed signal into digital form, providing a stream of corresponding digital output data. A digital subtraction circuit 24 is connected to the output of the ADC 22 and subtracts the stream of digital random noise words generated by PRN 18 from the ADC output data. Ideally, the dither component of the ADC output signal is perfectly removed. The resulting signal appearing at output 26 is thus the digital counterpart to the analog signal applied to input 12.

If the overall gain of a signal path from PRN source 18 through DAC 20 and ADC 22 is unity, then the entire dither signal is removed from the digital output by the foregoing subtraction. However, if the overall gain is not unity, the subtraction will not perfectly cancel the dither component, and a residue of the dither signal will remain in the digital output data stream.

In order to detect residue of the dither signal remaining in the digital output and thereby detect a non-unity gain of the dither signal path, correlation circuitry 28 comprising a multiplier 30 and an accumulator 32 is provided. Multiplier 30 multiplies (i.e. correlates) the digital data at output 26 with the stream of digital random noise words. Any residue of the dither signal remaining in the digital stream will correlate and accumulate in accumulator 32.

In order to reduce gain error resulting from the presence of the dither signal residue in the output, it is desired that the overall gain of the dither signal through DAC 20 and ADC 22 be exactly 1.0. The overall gain of the conversion is:

$$G_{overall} = G_{dec} * G_{adc} \quad (1)$$

(For purposes of the present discussion, gain errors caused by other elements, such as a summing amplifier that serves as summing node 16, are assumed to be included in $G_{adc}$.) To achieve an overall gain of 1.0, the gain of DAC 20 can be adjusted to equal $$G_{dec} = 1.0/G_{adc} \quad (2)$$

Therefore, a non-unity gain of the dither signal can be compensated by adjusting the gain of DAC 20.

In the illustrated embodiment, the gain of DAC 20 is set by an analog gain control signal applied to a gain control input 34 of the DAC (input 34 may, for example, control an analog amplifier circuit within the DAC). This analog control signal is generated by converting the accumulator's digital contents into analog form using a DAC 35, and filtering the high frequency edge transitions in the resulting signal with a low pass filter 37. By this arrangement, the gain of DAC 20 is set in response to the amount of correlation reflected in accumulator 32. Such feedback control ensures that the dither signal is completely subtracted out of the digital output stream. Errors resulting from residue of the dither signal remaining in the digital output stream are thus eliminated.

The hardware described above can be simplified without sacrificing effective operation. First, the correlation performed by multiplier 30 and accumulator 32 need not be performed on every sample in the digital stream. The correlation can instead be performed on only a fraction of the samples, such as every third sample, while still providing effective feedback control of the dither signal gain. In this way, multiplier 30 and accumulator 32 can be operated at a rate considerably less than that of the conversion circuitry.

A second simplification can be made to the correlation circuitry by correlating only the most significant bits of the dither signal against the digital output stream. If this is done, care must be taken that the other bits of the dither signal do not interfere with the correlation of the most significant bits with the digital output stream. However, effective correlation is still possible using just the most significant bits of the dither signal while greatly simplifying multiplier 30 and accumulator 32.

As noted, the foregoing arrangement introduces certain complications, namely long error settling time (low loop bandwidth) and overload anomalies. To alleviate these problems, the illustrated ADC system 10 additionally includes a preload register (memory) 36, an overload detector 38, and associated control circuitry 40.

To overcome the consequences of low loop bandwidth, the foregoing elements cooperate to load an initialization accumuland from memory 36 into the accumulator on power-up. The loaded initialization accumuland has a value approximating the accumulator value during steady state operation, after the errors have settled out. This initialization procedure permits near-optimum operation to begin immediately with power-up.

The value of the initialization accumuland stored in memory 36 is set by sampling the actual accumuland during steady state operation. In one embodiment, the actual accumuland is sampled in response to a user calibration request and is written to memory 36. In other embodiments, the accumulator value is automatically and periodically sampled during operation (e.g. every five minutes) and is written to memory (The latter approach is generally preferable since it permits the latest value before the last power-down to be loaded into the accumulator at the next power-up.)

To overcome the consequences of overload, a similar procedure is used. However, before detailing this procedure, it may be helpful to explain why more readily apparent solutions are ineffective.

Any solution to the overload issue requires accurate detection of overload conditions. (Circuitry for detecting overloads can be as simple as a threshold detector or a carry bit detector.) When an overload occurs, the overload detector flags the corresponding output digital sample(s). One technique for using this information, although ultimately a poor choice, is to decimate (i.e. disregard) the converted signal at the overloaded sample time, thereby preventing its correlation. This would seem to be a logical choice since the offensive digital output signal would be prevented from corrupting the accumulator. In practice, however, this approach interferes with the fundamental premise on which dithered ADCs are based—the statistical nature of the dither signal. Rather than correcting the overload problem, such decimation merely replaces one corruption mechanism with another. The result is the same: a growing error accumulates in the accumulator, causing the subtraction errors to get progressively worse. This phenomenon is particularly acute with so-called large scale dither.

To elaborate, the theory of operation of dithered ADCs is predicated on the fact that the expected value (average) of the dither signal is zero. If the dither signal is perfectly cancelled from the output signal (i.e. the dither residue in the output signal is zero), the dither and the output signal are entirely independent, so their product—accumulated over many samples—tends towards zero. (The accumulated product of a zero-mean function [PRN] with a non-zero mean function [ADC output] is zero.)

In an overload condition, however, the dither and the output signal are not entirely independent overload is more likely to occur with large dither values than with small. If output samples during overload conditions are disregarded (i.e. decimated), then large dither value samples are disregarded more frequently than small dither values. This skews the probability density function of the effective dither signal. (The effective dither signal being those dither samples that are not disregarded due to overloads). The result is that the dither signal no longer has an expected value of zero. (The accumulated product of a non-zero-mean function [decimated PRN] with a non-zero mean function [ADC output] is non-zero.) Thus, the accumulated correlation no longer tends towards zero, even in the case where the dither is perfectly cancelled from the output signal. The feedback loop will settle, if at all, with dither residue present in the output signal.

The foregoing is shown graphically in FIG. 4. FIG. 4a shows a representative output of PRN source 18. This signal has a mean value of zero. FIG. 4b shows the digital counterpart to the analog input signal. FIG. 4c shows the sum of FIGS. 4a and 4b and represents the output expected from ADC 22. FIG. 4c further has a line 42 representing the overload threshold of ADC 22. As can be seen, this threshold is crossed during one sample period. If this sample period is disregarded (as indicated by the cross hatching), then the corresponding sample contributed by the PRN source 18 is likewise disregarded. This decimation changes the amplitude distribution of the dither and thereby skews the mean dither value from zero to a non-zero value (here slightly negative). Operation of the system is thereby corrupted, and as a consequence the feedback control loop makes unwarranted adjustments to the dither gain.

In accordance with an aspect of the present invention, overload is addressed, instead, by initializing the accumulator as noted above, this time in conjunction with overload detector 38. In the event of an overload, the accumulator contents are initialized by the best currently known value before the overload occurred. Any degradation in accumulator contents which occurred as the result of the overloads is erased by the reinitialization of the accumulator. Hence, any statistical aberration in the average expected value of the dither corrupted by overloads is not incorporated into the accumulator contents. (Of course, care must be taken not to permit a corrupted accumuland—which might be present in the accumulator for a sample period before reinitialization is completed—from being sampled and stored into memory 36 as an initialization accumuland. This can be readily accomplished by disabling writes to memory 36 immediately upon detection of an overload.)

In the preferred embodiment, the overload reinitialization of the accumulator contents is implemented dynamically on a per-sample basis, thereby allowing for uninterrupted operation of the ADC system 10.

From the foregoing, it will be recognized that the present invention solves two critical problems in the practical implementation of a dithered ADC system. The described embodiment makes possible the initialization of the dither operation of the ADC for nearly-optimal operation immediately following power-on. Second, the described embodiment makes possible the uninterrupted operation of the ADC system even in the event of an overload (i.e. without a lengthy recovery period).

Having illustrated and described the principles of my invention with reference to a preferred embodiment thereof, it should be apparent to those skilled in the art that the invention can be modified in arrangement and detail without departing from such principles. For example, while the invention has been illustrated with reference to a hardware-based implementation, it will be recognized that many of the constituent system operations can be performed in software as well. Similarly, while the invention has been illustrated with reference to a system in which the gain of the dither signal is set by controlling the gain of the DAC 20, in other embodiments, this gain correction can take place elsewhere, such as in a separate gain control block in the dither signal path, or in the ADC itself.

In view of the many possible embodiments to which the principles of my invention can be put, it should be recognized that the detailed embodiments are illustrative only and should not be taken as limiting the scope of my invention. Rather, I claim as my invention all such embodiments as may come within the scope and spirit of the following claims and equivalents thereto.

We claim:

1. An analog to digital conversion circuit comprising:

an input for receiving an analog input signal;

dither circuitry for producing corresponding analog and digital dither signals;

an analog summation circuit connected to the dither circuitry and the input for adding the analog dither signal and the analog input signal to produce a summed signal;

at least one analog-to-digital converter having an input coupled to the analog summation circuit and having an output providing a digital output stream;

a subtraction circuit coupled to the converter output for subtracting the digital dither from the digital output stream to provide an output signal;

an accumulator;

a memory for storing a non-zero initialization value that can be selectably loaded into the accumulator;

a correlator coupled to the dither source and the subtraction circuit for generating a correlation signal related to dither residue detected in the output signal, the correlator having an output coupled to the accumulator; and gain control circuitry for controlling the gain of a circuit through which at least one of the dither signals pass responsive to data accumulated in the accumulator.

2. The circuit of claim 1 comprising an analog amplifier circuit for scaling the amplitude of the analog other signal in response to the gain control circuitry.

3. The circuit of claim 1 wherein the at least one analog-to-digital converter is a single analog-to-digital converter having an adjustable gain, said gain being responsive to the gain control circuitry.

4. The circuit of claim 1 wherein the dither circuitry comprises a digital-to-analog converter having an adjustable gain, said gain being responsive to the gain control circuitry.

5. The circuit of claim 1 which further includes an overload detector, the overload detector causing the initialization value to be loaded from the memory into the accumulator in response to a detected overload event.

6. The method of claim 1 wherein the gain control circuitry controls the gain of a circuit through which the analog dither signal passes responsive to data accumulated in the accumulator.

7. In an analog-to-digital converter having means for adding a dither signal prior to conversion, and means for removing the dither signal after conversion, an improvement comprising a correlation accumulator and a memory cooperating to initialize a gain of the dither signal to a preestablished value.

8. The converter of claim 7 which further includes an overload detector cooperating with the correlation accumulator and the memory to initialize the gain of the dither signal to the preestablished value upon detection of an overload event.

9. In a method of converting an input analog signal to an output digital signal, the method including adding and subsequently removing a dither signal to improve conversion accuracy, an improvement comprising:

initializing an accumulator with a non-zero initial datum;

correlating the output digital signal with the dither signal to produce a correlation signal;

accumulating the correlation signal with the initial datum in the accumulator; and controlling the gain of a circuit stage through which the dither signal passes in response to the: data accumulated in the accumulator.

10. The method of claim 9 in which the dither signal is a digital signal.

11. The method of claim 9 in which the generating step further includes multiplying the output signal with the dither signal to produce the correlation signal.

12. The method of claim 9 which further includes detecting an overload and performing the initializing step in response thereto.

13. The method of claim 9 which includes performing the initialization step on power-on.

14. The method of claim 9 which includes reading an accumuland from the accumulator and storing said accumuland in a memory.

15. The method of claim 14 in which the reading step includes reading in response to a user calibration request.

16. The method of claim 15 in which the reading step includes reading periodically.

\* \* \* \* \*